(12) United States Patent
Reck et al.

(10) Patent No.: US 6,308,139 B1
(45) Date of Patent: Oct. 23, 2001

(54) DIGITAL PROCESS FOR DETERMINING THE EFFECTIVE VALUE OF A PERIODIC ELECTRIC TEST SIGNAL

(75) Inventors: Thomas Reck; Tevfik Sezi, both of Berlin (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 08/765,726

(22) PCT Filed: Jun. 27, 1995

(86) PCT No.: PCT/DE95/00874

§ 371 Date: Jun. 25, 1997

§ 102(e) Date: Jun. 25, 1997

(87) PCT Pub. No.: WO96/00906

PCT Pub. Date: Jan. 11, 1996

(30) Foreign Application Priority Data

Jun. 28, 1994 (DE) ................................................ 44 23 763

(51) Int. Cl.$^7$ .................................................... G01R 19/02
(52) U.S. Cl. ............................ 702/57; 341/120; 341/122; 702/66
(58) Field of Search ................................ 702/57, 66, 75; 341/118, 120, 144, 155, 122

(56) References Cited

U.S. PATENT DOCUMENTS

| 4,527,278 | * | 7/1985 | Deconche et al. ..................... 375/344 |
| 5,265,039 | * | 11/1993 | Curbelo et al. ....................... 341/118 |
| 5,659,312 | * | 8/1997 | Sunter et al. ......................... 341/120 |

FOREIGN PATENT DOCUMENTS

| 32 22 087 A1 | 12/1983 | (DE) . |
| 39 28 083 A1 | 2/1991 | (DE) . |
| 41 22 399 A1 | 1/1993 | (DE) . |
| 44 20 348 | 6/1994 | (DE) . |

OTHER PUBLICATIONS

Buch von Germer und N. Wefers, "Messelektronik," Band 2,2. Auflage, 1990, Seite 15, Reference is described in the Specification.

* cited by examiner

*Primary Examiner*—Marc S. Hoff
*Assistant Examiner*—Hien Vo
(74) *Attorney, Agent, or Firm*—Kenyon & Kenyon

(57) ABSTRACT

A digital process for determining the effective value of a periodic electric test signal is provided, where the test signal is sampled during a sampling interval that differs in duration from the period of the test signal, and after performing an analog-digital conversion of the samples, they are squared, added up and averaged. The square root of the resulting average is calculated. To be able to determine the effective value rapidly and with a high accuracy according to this invention with a sampling interval that corresponds to two periods of the electric test signal with an odd numbered M of samplings with N samples that fall in one period of the test signal, the values up to and including the Nth sample are squared and added up. To this is added a correction factor that corresponds to half of the square of a subtotal formed from one-quarter of the Nth sample and three-quarters of the (N+1)th sample, where $N=(M-1)/2$. Then the average is calculated over the number M/2.

3 Claims, 1 Drawing Sheet

DIGITAL PROCESS FOR DETERMINING THE EFFECTIVE VALUE OF A PERIODIC ELECTRIC TEST SIGNAL

BACKGROUND INFORMATION

The present invention is directed to a system and process for determining the effective value of a periodic signal.

It is known, that the effective value of a test signal can be determined digitally from samples of a periodic electric test signal using the following equation (1):

$$I = \sqrt{\frac{1}{N} \sum_{K=0}^{N-1} i^2(k)} \tag{1}$$

See H. Germer and N. Wefers, Electronic Measurements, vol. 2, 2nd edition, 1990.

In this equation, I denotes the effective value of the periodic electric test signal, N denotes the number of samplings per period of the electric test signal and i(k) is the respective sample.

It is also known from the Germer and Wefers book that relatively large errors occur in determining the effective value of a periodic electric test signal when the duration of the sampling interval differs greatly from the period of the test signal. To nevertheless determine the effective value of a periodic electric test signal with a relatively high accuracy when there are differences between the duration of the sampling interval and the period of the test signal, German Patent DE 4,122,399 A1 discloses that the sampling interval can be shifted by one clock cycle with respect to the electric test signal, and corresponding effective values can then be determined from the resulting samples. The effective values thus obtained are used to calculate an average value, which gives the effective value of the test signal, regardless of frequency.

SUMMARY OF THE INVENTION

The present invention discloses a digital process for determining the effective value of a periodic electric test signal, where the test signal is sampled during a sampling interval whose duration is different from the period of the test signal, the samples are subjected to an analog-digital conversion, then squared, added up and averaged in an arithmetic unit, then the root of the resulting average is calculated accordingly, an object of the present invention is to determine quickly (after one period of the test signal) and with a high accuracy the effective value of the periodic electric signal.

With a sampling interval that corresponds in duration to two periods of the electric test signal having an odd number of M samplings with N samples that falling in one period of the test signal, the object of the present invention is achieved by squaring and adding the values up to and including the Nth sample. To the resulting total there is added as a correction factor a value that corresponds to half of the square of a subtotal formed from one quarter of the Nth sample and three quarters of the (N+1)th sample, where N=(M−1)/2, and the average is calculated over the number M/2 samples.

The main advantage of the process according to this invention is that despite a difference in duration between the sampling interval and the period of the test signal, the effective value of the periodic electric test signal can be determined with a high accuracy after just one period of the electric test signal, because the effective value (containing an error) that can readily be calculated from the samples after one period of the electric test signal is corrected. This permits the use of samples to determine the effective value which is formed with regard to other measurement tasks involving the periodic electric test signal such that sampling is performed with a non-integer multiple of the fundamental frequency component of the test signal in order to be able to detect harmonics of a higher order (see German Patent Application P 44 20 348.9).

DETAILED DESCRIPTION

Figure 1:
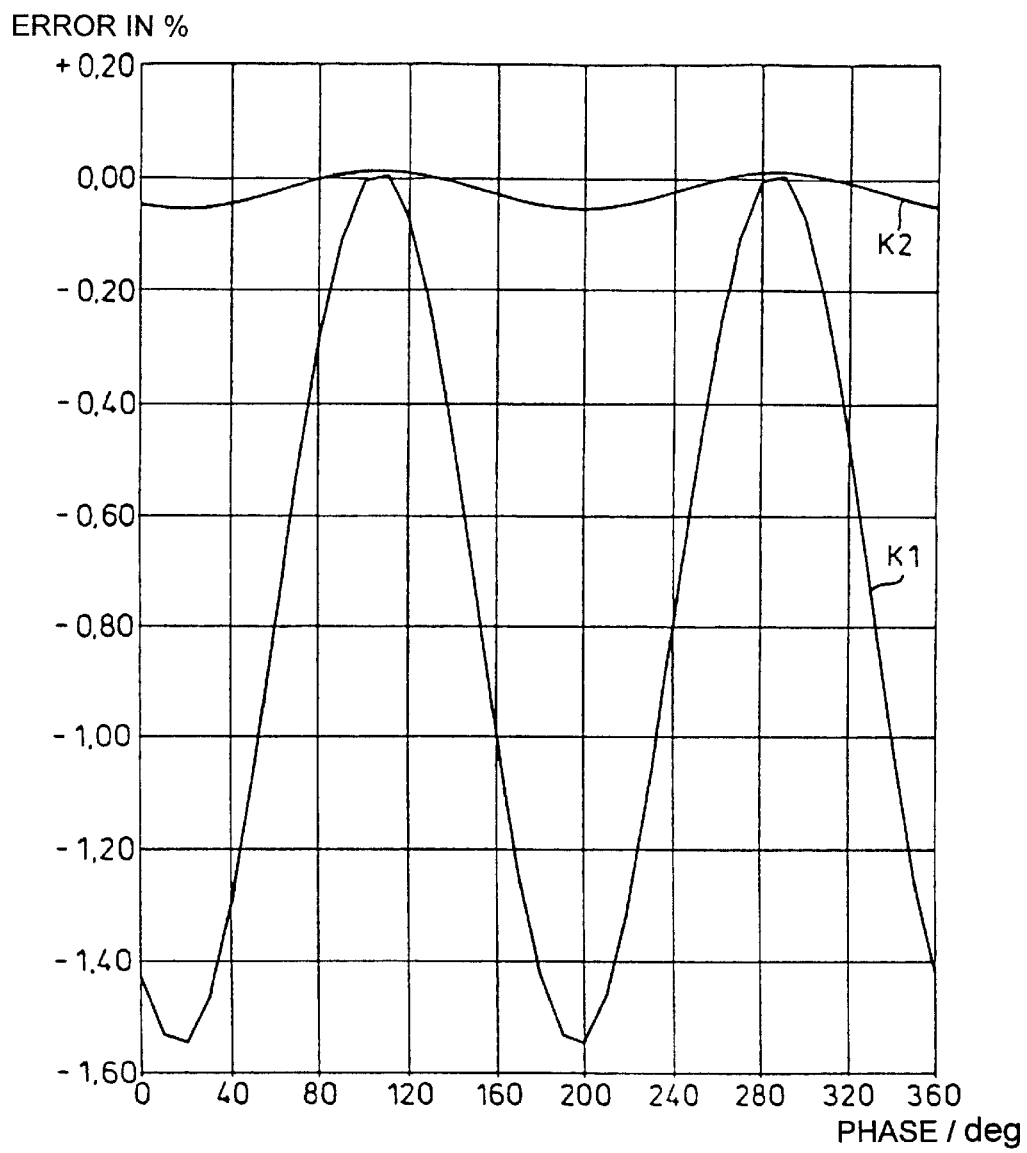
FIG. 1 illustrates two error curves corresponding to different measurements of the effective value of a periodic test signal.

According to this invention, it is assumed that M samplings of a periodic electric test signal derived from the current or voltage in an electric power supply network are performed during two periods of the network parameters, where M is an odd-numbered integer. If a measurement period equal to only one line period can be allowed from the standpoint of the required rapid determination of an effective value, this yields the following result for N samplings per period from a purely mathematical standpoint:

$$N = M/2 \tag{2}$$

Furthermore, if we make the admissible formulation, with periodic electric test signals derived from line voltages or line currents, that i(k) can be represented by the following equation (3):

$$i(k) = \cos\left(\frac{4\pi k}{M} + \varphi\right), \tag{3}$$

and if equation (3) is substituted into equation (1), this yields equation (4) after an elementary calculation:

$$I_N = \sqrt{\frac{2}{M}\left[\frac{N}{2} + \frac{1}{2}\cos\left(\frac{4\pi}{M}(N-1) + 2\varphi\right)\sin\frac{4\pi}{M}\frac{N}{\sin 4\frac{\pi}{M}}\right]} \tag{4}$$

Equation (4) then yields the following effective value for N=M/2:

$$I_N = I = \sqrt{\frac{2}{M}\left[\frac{M}{4}\right]} \tag{5}$$

For example, if M=33 is selected, so that 33 samplings are performed in two periods of a periodic electric test signal derived from a line current or a line voltage, then the effective value defined in equation (5) could be determined only if 16.5 samplings per period of the electric test signal were analyzed. However, such a number of samplings cannot be implemented from a technical standpoint. For example, only N=16 samplings in one period can be taken into account. However, as shown by an error analysis, this yields a maximum error of 1.6% as indicated by curve K1 in FIG. 1. Such an error is unacceptable for many measurement problems.

Therefore, according to this invention, the following equation (6) is used:

$$I_{Kor} = \sqrt{\frac{2}{M} \cdot \left[\sum_{K=0}^{N-1} i^2(k) + KE\right]}, \quad (6)$$

where KE denotes a correction factor that can be represented by the following equation:

$$KE = \frac{M}{4} - \left[\frac{N}{2} + \frac{1}{2}\cos\left(\frac{4\pi}{M}(N-1) + 2\varphi\right)\sin\frac{4\pi}{M}\frac{N}{\sin 4\frac{\pi}{M}}\right] \quad (7)$$

In equation (7), the subtrahead M/4 leads to the effective value obtained with mathematical accuracy at 16.5 samplings per period (in the present example). The term in brackets is subtracted from this if N=16samplings are taken into account.

If the values for M=33 and N=16 are substituted into equation (7), this yields an equation like the following equation (8) for the correction factor KE:

$$KE = \frac{1}{4} - \frac{1}{2}\cos\left(\frac{4\pi}{33}15 + 2\varphi\right)\sin\frac{4\pi}{33}\frac{16}{\sin 4\frac{\pi}{33}} \quad (8)$$

Since the quotient of the two sine values in equation (8) is approximately =0.5, the correction factor KE can also be expressed by the following equation (9):

$$KE \approx \frac{1}{4} + \frac{1}{4}\cos\left(\frac{4\pi}{33}15 + 2\varphi\right) = \frac{1}{2}\cos^2\left(\frac{4\pi}{33}7.5 + \varphi\right) = \frac{1}{2}i^2(k=7.5) \quad (9)$$

However, this equation (9) cannot be readily used in determining the effective value because there is no sample at k=7.5. Therefore, an interpolation is performed. The following periodicity is used to determine the effective value with the greatest possible accuracy even with even-numbered harmonics:

$$\frac{1}{2}i^2(7.5) = \frac{1}{2}\cos^2\left(\frac{4\pi}{33}7.5 + \varphi\right) = \quad (10)$$

$$\frac{1}{2}\cos^2\left(\frac{4\pi}{33}7.5 + \pi + \varphi\right) = \frac{1}{2}\cos^2\left(\frac{4\pi}{33}15.75 + \varphi\right) = \frac{1}{2}i^2(15.75)$$

Since there is no sample at k=15.75, the following interpolation is performed:

$$i(15.75) = 0.25i(15) + 0.75i(16) \quad (11)$$

Taking into account equation (6), the following equation can be formulated for the corrected effective value $I_{kor}$:

$$I_{kor} = \sqrt{\frac{\left[\sum_{k=0}^{15} i^2(k)\right] + \frac{1}{2}[0.25i(15) + 0.75i(16)]^2}{16.5}} \quad (12)$$

FIG. 1 shows the error curve with the correction performed here in the form of curve K2.

In generalized terms, the correction equation is obtained:

$$I_{kor} = \sqrt{\frac{2\left[\sum_{k=0}^{N-1} i^2(k)\right] + \left(\left[\frac{1}{4}i(N-1) + \frac{3}{4}i(N)\right]\right)^2}{M}} \quad (13)$$

Figure 2:
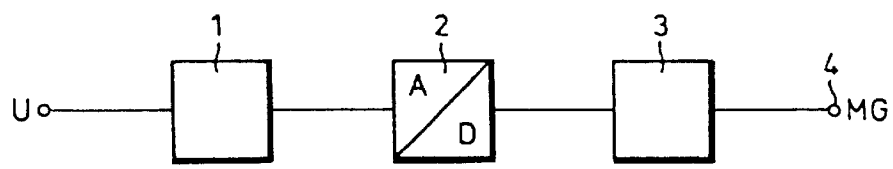
FIG. 2 illustrates a system according to the present invention for determining the effective value of a periodic test signal.

FIG. 2 Illustrates a system for carrying out the process according to present invention. This system contains at the input a sampling device 1 that receives at its input a periodic electric test signal U whose effective value is to be determined. Downstream from sampling device 1 is an analog-digital converter 2 which in turn has an arithmetic block 3 connected downstream from it. After being digitized, the samples supplied by sampling device 1 are squared, added up and averaged in this arithmetic block 3, as shown in the above equations. Correction factor KE is also formed, and thus a measurement quantity MG that gives the effective value of the electric test signal U at the input of sampling device 1 is generated at output 4.

What is claimed is:

1. A method of determining an effective value of a periodic electric test signal, comprising:

sampling with a sampling device and an analog-digital converter the periodic electric test signal during a sampling interval to produce M samples, wherein M is an odd number, wherein the sampling interval corresponds to at least two periods of the periodic electric signal, and wherein N samples of the M samples correspond to a first one of the at least two periods of the periodic electric signal;

squaring and adding the samples up to and including the Nth sample to produce a resulting total;

multiplying the first resulting total by two and dividing by M to produce a second resulting total;

adding to the resulting total a correction factor to produce a third resulting total, wherein the correction factor corresponds to a square of a subtotal obtained from one-quarter of the Nth sample and three-quarters of the (N+1)th sample;

dividing the third resulting total by M to produce a fourth resulting total;

extracting a square root of the sum of the second and fourth resulting total to produce the effective value of the periodic test signal; and providing the effective value at an output.

2. An arrangement for producing a measurement quantity which provides an effective value of an electric test signal applied to an input of the arrangement, the arrangement comprising:

a sampling device sampling the periodic electric test signal during a sampling interval to produce M samples, wherein the sampling interval corresponds to at least two periods of the periodic electric signal and wherein N samples of the M samples correspond to a first one of the at least two periods of the periodic test signal;

an analog-to-digital converter downstream from the sampling device and digitizing the M samples; and an arithmetic block downstream from the analog-to-digital converter, the arithmetic block producing the measurement quantity by:

squaring and adding the digitized samples up to and including the Nth digitized sample to produce a first resulting total;

multiplying the first resulting total by two to produce a second resulting total;

adding to the resulting total a correction factor to produce a third resulting total, wherein the correction factor corresponds to a square of a subtotal obtained from one-quarter of the Nth sample and three-quarters of the (N+1)th sample;

dividing the third resulting total by M to produce a fourth resulting total; and extracting a square root of the fourth resulting total to produce the effective value of the periodic test signal.

3. A method of determining an effective value of a periodic electric test signal, comprising:

sampling with a sampling device and an analog-digital converter the periodic electric test signal during a sampling interval to produce M samples, wherein M is an odd number, wherein the sampling interval corresponds to at least two periods of the periodic electric signal, and wherein N samples of the M samples correspond to a first one of the at least two periods of the periodic electric signal; and determining a corrected effective value of the periodic electric test signal according to the equation:

$$I_{corrected} = \sqrt{\frac{2}{M}\left(\left[\sum_{k=1}^{N} i^2(n)\right] + \frac{1}{2}\left[\frac{1}{4}i(N) + \frac{3}{4}i(N+1)\right]^2\right)};$$

wherein i(n) is a value of the $n^{th}$ sample of the periodic electric test signal.

* * * * *